Figure 1:
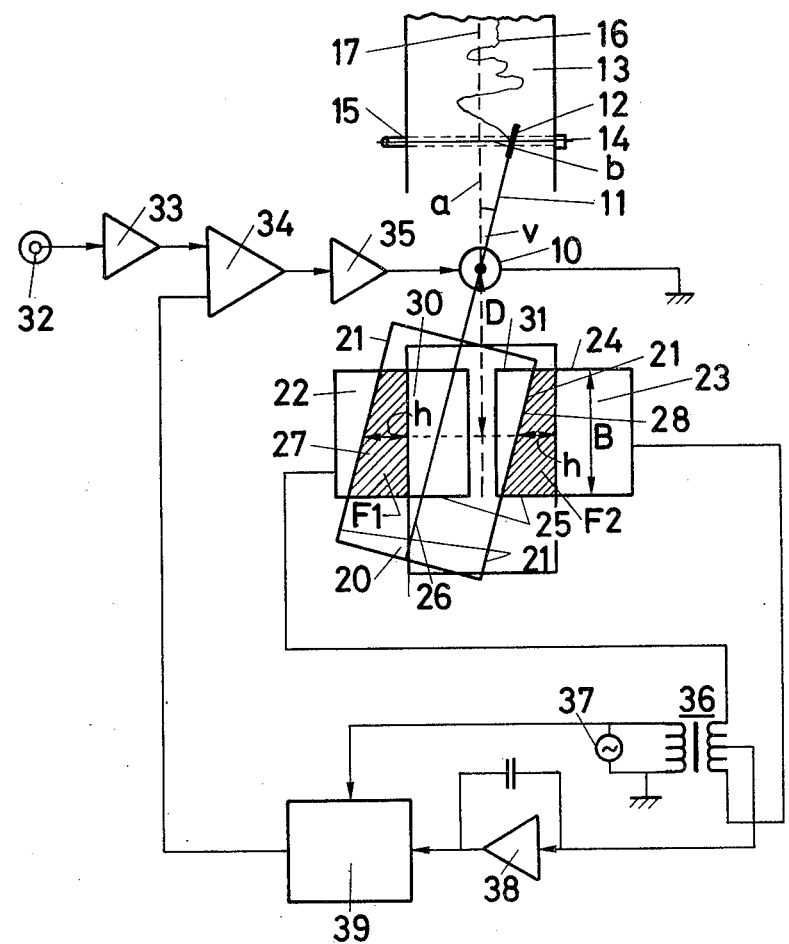

United States Patent [19]

Fauerskov et al.

[11] 4,323,903
[45] Apr. 6, 1982

[54] STRIP CHART RECORDER WITH A DIFFERENTIAL CAPACITOR SERVING AS POSITION SENSOR IN A POSITION SERVO FOR THE RECORDING PEN

[75] Inventors: Svend E. Fauerskov, Holte; Svend O. Sjøstrøm, Copenhagen, both of Denmark

[73] Assignee: A/S Brüel & Kjaer, Naerum, Denmark

[21] Appl. No.: 217,010
[22] PCT Filed: Mar. 21, 1980
[86] PCT No.: PCT/DK80/00017
  § 371 Date: Nov. 22, 1980
  § 102(e) Date: Nov. 14, 1980
[87] PCT Pub. No.: WO80/02070
  PCT Pub. Date: Oct. 2, 1980

[30] Foreign Application Priority Data

Mar. 22, 1979 [DK] Denmark ............... 1171/79

[51] Int. Cl.³ ........................................... G01D 15/00
[52] U.S. Cl. ....................................... 346/32; 318/662; 324/61 R
[58] Field of Search ................. 346/32, 31; 318/662; 340/870.37; 324/61 R, 100

[56] References Cited

U.S. PATENT DOCUMENTS

| | | | |
|---|---|---|---|
| 3,340,536 | 9/1967 | Sauber | 346/32 |
| 3,668,672 | 6/1972 | Parnell | 340/200 |
| 3,683,402 | 8/1972 | Parnel | 346/32 |
| 3,783,374 | 1/1974 | Eide et al. | 324/60 C |
| 3,924,177 | 12/1975 | Lemineur et al. | 324/61 R |

FOREIGN PATENT DOCUMENTS

| | | |
|---|---|---|
| 1297877 | 5/1969 | Fed. Rep. of Germany . |
| 2254567 | 11/1972 | Fed. Rep. of Germany . |
| 2324472 | 5/1973 | Fed. Rep. of Germany . |
| 2523163 | 5/1975 | Fed. Rep. of Germany . |

Primary Examiner—L. T. Hix
Assistant Examiner—W. J. Brady
Attorney, Agent, or Firm—LeBlanc, Nolan, Shur & Nies

[57] ABSTRACT

Strip chart recorders in which the curve is recorded by means of a rotatable pen (11) which traces the curve in a line of contact (14) being a generatrix of a supporting roller (15), suffer from a plotting error originating from the fact that the ordinate of the curve, which should be proportional to the angle of deflection v of the pen, is proportional to the tangent of said angle. This plotting error, that makes it impossible to carry out measurements on the curve, can be compensated for by incorporating in the position servo, which serves to overcome frictional losses in the recorder, a position sensor of a differential capacitor type (20, 22, 23) the differential capacitance of which, as a function of the angle of deflection v of the pen, is proportional to the tangent of v. According to one embodiment of the invention this is achieved by the rotor plate (20) and the stator plates (22, 23) of the differential capacitor each being bounded by a set of parallel lines (21, and 24, 25), and in that the differential capacitor, when being in its mid-position, displays mirror symmetry about a plane perpendicular to the plates and passing through a zero line (17).

4 Claims, 4 Drawing Figures

STRIP CHART RECORDER WITH A DIFFERENTIAL CAPACITOR SERVING AS POSITION SENSOR IN A POSITION SERVO FOR THE RECORDING PEN

The present invention relates to strip chart recorders each having a recording arm rotatable about a shaft perpendicular to the recording plane and the angular position of which is servo-controlled inasmuch as a position sensor of a differential capacitor type is incoporated in a position servo for the recording pen.

In strip chart recorders of the type in which the recording unit consists of a pen motor having a pen rotatable about the shaft of the pen motor, and being of a length a from the shaft to the tracing point, which is the point of contact between the rotatable pen and a straight line which is a generatrix of a recording roller mounted under the paper strip, the ordinate b of the traced curve, i.e. its distance from a zero line, will not be proportional to the angle of deflection of the pen but be subjected to a certain distortion. The length of the ordinate b will be equal to the product of the length a of the pointer in its zero position and the tangent of the angle of deflection v of the pen:

$$b = a \cdot \tan v.$$

This error distorts the shape of the traced curve and prevents the measurement thereof.

In connction with such strip chart recorders it is a known practice to use a position servo in securing that the movements of the pen are unaffected by the friction in the recorder, and such a position servo includes a position sensor which may be a potentiometer, an optical transducer, an inductive transducer or, most simply, a differential capacitor consisting of two stator plates and a rotor plate in the shape of a segment of a circle, which overlaps the two stator plates and the capacitance of which varies in proportion to the angle of deflection of the rotor.

The object of the present invention is to provide a strip chart recorder having a differential capacitor which, when incorporated in the position servo, is capable of compensating for the above-mentioned tangent error. According to the invention this is achieved by shaping the rotor plate and the stator plates of the differential capacitor in such a way that, for a deflection of the rotor plate assembly through an angle v, the overlap area A of the plates changes by an amount $\Delta A$ which is proportional to the tangent of the angle v.

According to one embodiment of the invention this is achieved in that the two stator plates each have two parallel edges, that the rotor plate assembly has two straight edges each of which makes up the same angle with corresponding parallel edges of the stator plate assembly, and that, when the rotor plate assembly is in its mid-position, the aforesaid edges of the rotor and stator plate assemblies display mirror symmetry about a plane perpendicular to the plates and passing centrally between the two plate assemblies.

According to an embodiment of the invention this is achieved in a particularly simple manner in that the rotor plate assembly and the stator plate assemblies of the differential capacitor both are bounded by two parallel straight lines.

Thereby it is ensured that the ordinate of the curve on the recording strip is proportional to the input signal.

Other embodiments will be more particularly described in conjunction with the explanation of the drawings.

Figure 2:
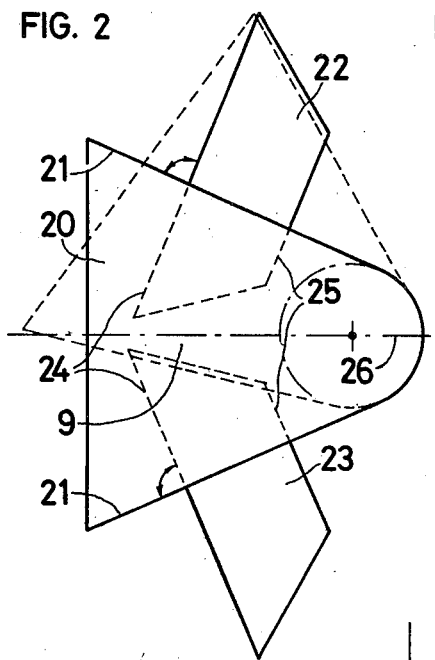
Figure 3:
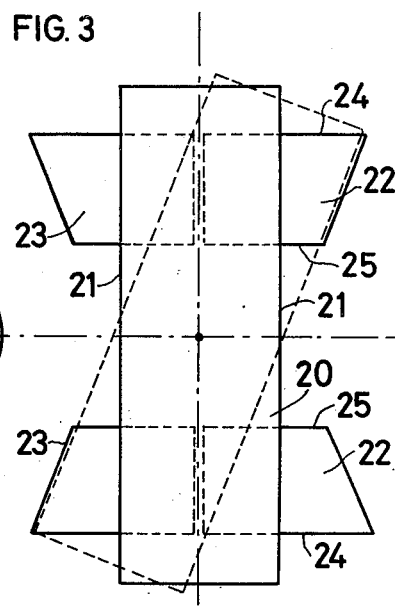
Figure 4:
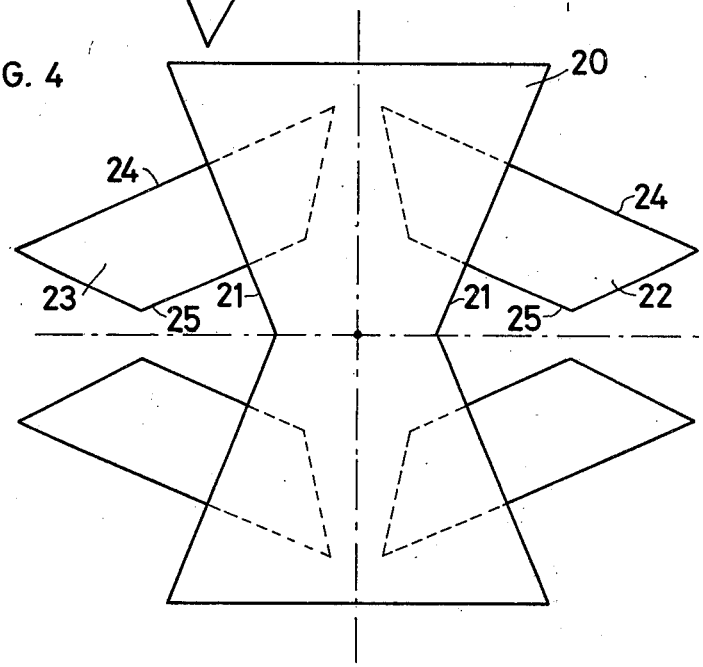

The invention will now be more particularly described with reference to the drawings, in which:

FIG. 1 is a block diagram of a position servo for a strip chart recorder having an embodiment of a differential capacitor in accordance with the invention; and FIGS. 2 to 4 illustrate various modified embodiments of a differential capacitor for a strip chart recorder in accordance with the invention.

A pen motor is provided with a pen 11 having a heated tracing tube 12 which, along a generatrix 14 of a supporting roller 5, makes edgewise contact with a strip 31 of waxed paper thereby tracing a curve 16 on the paper strip 13, which is advanced at a constant rate by means not illustrated. When the pen 11 is deflected through an angle v by an input signal, the curve 16 will attain an ordinate value b relative to a zero line 17. It can be seen that this ordinate value b is equal to a tan v, where a is the length of the pen reckoned from its shaft to the recording point in the zero position of the pen.

A differential capacitor comprises a rotor plate 20 having two parallel side edges 21 and a stator plate assembly 22, 23 bounded by two paralles lines 24, 25. The rotor plate 20 is attached along its mid-line 26 to an extension of the pen 11. For the sake of clarity, the differential capacitor is shown mounted on a rearward extension of the pointer. In a practical embodiment, the differential capacitor would be located below the pointer 11 itself. The capacitance $\Delta C$ of a differential capacitor is equal to the difference between the capacitances between the rotor plate and each of the two respective stator plates. A deflection from the mid-position into the position illustrated causes the capacitance on the left to increase by the hatched area F1 and the capacitance on the right to decrease by the hatched area F2. Hence $\Delta C = F1 + F2 = 2BD \cdot \tan v$, where B is the distance between the parallel edges 24 and 25 of the stator plates and D is the distance from the shaft of the pen motor to the mid-height h of the hatched trapezia. Thus the capacitance of the differential capacitor will be equal to a constant multiplied by the tangent of the angle of deflection v.

The signal to be recorded on the strip chart 13 is applied to an input terminal 32, which is connected to a signal amplifier 33, which in turn is connected to one of the input terminals of a differential amplifier 34. The output terminal of the latter is connected to a zero-point amplifier 35, which drives the pen motor 10. As illustrated, the rotor plate 20 of the differential capacitor is connected to common (ground), whereas the stator plates 22, 23 are connected to either ends of the secondary of a transformer 36, the primary of which is connected to an oscillator 37. The mid-point of the secondary of the transformer 36 is connected to an operational amplifier 38 provided with capacitive feed back, the output of which amplifier together with the signal from the oscillator 37, is applied to a synchronous detector 39, the output terminal of which is connected to the other input terminal of the differential amplifier 34. Apart from the special design of the differential capacitor, this arrangement forms a position servo known per se and which, moreover, serves to overcome losses due to friction in the recorder.

In consequence of the special design of the differential capacitor, there is introduced into the servo loop a correction which is proportional to the tangent of the angle of deflection v of the pen, whereby the ordinate of the curve 16 is corrected for the above-mentioned error.

In the differential capacitor shown in FIG. 2 the edges 21 of the rotor plate assembly are not parallel, as in the differential capacitor illustrated in FIG. 1, but they have been turned together with the parallel edges 24, 25 of the stator plate assemblies 22, 23, through equal angles in opposite directions, so that, when the rotor plate assembly is in zero position, the edge 21 is perpendicular to the edge 24 of the stator plate assembly 22, and similarly for the assembly 23. Thus nothing is changed with respect to the capacitances.

FIGS. 3 and 4 illustrate double duplex differential capacitors corresponding to the embodiments shown in FIG. 1 and FIG. 2, respectively. It will be seen that the duplex differential capacitors display mirror symmetry about two mutually perpendicular axes. They may be incorporated in the circuit shown in FIG. 1 by cross-connecting the stator plates, or they may be incorporated in a balanced oscillator set-up (not illustrated).

Furthermore, if the desired maximum angle of deflection is small, one could use multiple sektions instead of the two sections shown. This results in an n-fold increase in the deflection sensitivity $\Delta C/\Delta \tan v$, where n is the number of sections mounted on the rotor.

What is claimed is:

1. A strip chart recorder including a recording arm rotatable about a shaft perpendicular to the recording plane and the angular position of which is servo-controlled inasmuch as a position sensor of a differential capacitor type is incorporated in a position servo for the recording pen, characterized in that the rotor plate and the stator plates of the differential capacitor are so shaped that, for a rotation of the rotor plate through an angle v, the overlap area A of the plates changes by an amount $\Delta A$ which is proportional to the tangent of the angle v.

2. A strip chart recorder as claimed in claim 1, characterized in that the two stator plate assemblies (22, 23) each have two parallel edges (24, 25), that the rotor plate assembly (20) has two straight edges (21, 21) each of which makes the same angle to corresponding parallel edges (24, 25) of the stator plate assembly, and that, when the rotor plate assembly is in its mid-position, the aforesaid edges of the rotor plate and the stator plate assemblies both display mirror symmetry about a plane perpendicular to the plates and passing centrally between the stator plate assemblies.

3. A strip chart recorder as claimed in claim 1, characterized in that each of the rotor and stator plates of the differential capacitor are bounded by a set of parallel edges (21, 21 and 24, 25).

4. A strip chart recorder as claimed in claim 1, characterized in that the differential capacitor is embodied as a double differential capacitor.

* * * * *

UNITED STATES PATENT AND TRADEMARK OFFICE
CERTIFICATE OF CORRECTION

PATENT NO. : 4,323,903
DATED : April 6, 1982
INVENTOR(S) : Svend E. Fauerskov & Svend O. Sjøstrøm It is certified that error appears in the above-identified patent and that said Letters Patent are hereby corrected as shown below:

In Foreign Patent Documents incorrect dates are listed for the following patents:

German Patent 1297877   "5/1969" should be --6/1969--.

German Patent 2254567   "11/1972" should be --5/1973--.

German Patent 2324472   "5/1973" should be --11/1973--.

German Patent 2523163   "5/1975" should be --1/1976--.

Column 2, line 14, change "5" to --15--.

Column 2, line 15, change "31" to --13--.

Signed and Sealed this

Tenth Day of August 1982

[SEAL]

Attest:

GERALD J. MOSSINGHOFF

Attesting Officer           Commissioner of Patents and Trademarks